(12) United States Patent
Im et al.

(10) Patent No.: US 8,103,233 B2
(45) Date of Patent: Jan. 24, 2012

(54) TUNER

(75) Inventors: Dong Gu Im, Seoul (KR); Jae Yup Lee, Seoul (KR); Hee Sub Lee, Seoul (KR); Hong Teuk Kim, Seoul (KR); Kwy Ro Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 492 days.

(21) Appl. No.: 12/344,920

(22) Filed: Dec. 29, 2008

(65) Prior Publication Data

US 2009/0176467 A1 Jul. 9, 2009

(30) Foreign Application Priority Data

Jan. 4, 2008 (KR) .................... 10-2008-0001355

(51) Int. Cl.
*H04B 1/16* (2006.01)
(52) U.S. Cl. ............... 455/193.1; 455/266; 455/340
(58) Field of Classification Search .......... 455/191.1, 455/193.1, 195.1, 197.1, 197.2, 266, 290, 455/340
See application file for complete search history.

(56) References Cited

U.S. PATENT DOCUMENTS

| | | | | |
|---|---|---|---|---|
| 6,968,173 B2* | 11/2005 | Cowley | | 455/323 |
| 6,978,125 B2* | 12/2005 | Lindell et al. | | 455/183.1 |
| 7,336,939 B2* | 2/2008 | Gomez | | 455/307 |
| 7,512,392 B2* | 3/2009 | Millard et al. | | 455/266 |
| 7,756,500 B1* | 7/2010 | Fulga et al. | | 455/266 |

* cited by examiner

*Primary Examiner* — Howard Williams
(74) *Attorney, Agent, or Firm* — Birch, Stewart, Kolasch & Birch, LLP

(57) ABSTRACT

The present disclosure relates to a tuner capable of receiving a television broadcasting signal of a wide band having an operating frequency bandwidth of 48 MHz~1 GHz, wherein the tuner filters a radio frequency (RF) signal outputted from the low noise amplifier using a tunable filter. The tunable filter includes according to an embodiment an inductor and a variable capacitor as passive elements to reject harmonics. The tuner includes a mixer which mixes an output signal of the tunable filter with a local oscillator signal and converts the mixed signal to an In-phase and Quadrature IF signal, where the converted IF signal of I channel and Q channel is processed through an IF signal processor and is converted to an appropriate signal by a demodulator.

18 Claims, 6 Drawing Sheets

TUNER

CROSS-REFERENCE TO RELATED APPLICATION

The present application is based on, and claims priority to, Korean Patent Application Number 10-2008-0001355, filed Jan. 4, 2008, the disclosure of which is incorporated by reference herein in its entirety.

BACKGROUND

The following disclosure relates to a tuner intrinsically installed in a television set and the like.

Typically, a receiver for receiving a television broadcasting signal, is installed with a tuner for receiving a television broadcasting signal and selecting channels.

The number of channels that are available in the television broadcasting is increasing. Due to such availability, a tuner having a wider band for receiving a television broadcasting signal of a wide operating frequency bandwidth of 48 MHz~1 GHz needs to be equipped in a television set or a set-top box capable of selecting a desired channel out of many channels. Further, as the demand for various broadcasting programs and frequent channel switching increases, a tuner is needed which can effectively tune to any desired channel in an efficient and reliable manner.

SUMMARY

The present disclosure provides a tuner installed with a tunable filter capable of effectively rejecting harmonics in the radio frequency (RF) signals.

The present disclosure also provides a tuner including a tunable filter comprised of passive elements, capable of rejecting harmonics by adjusting a center frequency and/or a cut-off frequency in response to a desired RF signal frequency.

Further, the present disclosure provides a tuner including a tunable filter for addressing limitations and disadvantages associated with the related art.

It will be understood that specific structural and functional details disclosed herein are not to be interpreted as limiting, but merely as a basis for claims and as a representative basis for teaching one skilled in the art to variously employ implementations of the present disclosure in virtually any appropriately detailed structure.

In one general aspect, a tuner according an embodiment of the present invention may comprise: a low noise amplifier for low-noise-amplifying a radio frequency (RF) signal received by the tuner; a tunable filter for filtering an output signal of the low noise amplifier while a center frequency of the tunable filter is changed in response to a channel control signal; a local oscillator for generating a local oscillator signal having a plurality of phases in a same frequency in response to the channel control signal; and a mixer for generating an In-phase and Quadrature IF (intermediate frequency) signal by mixing output signals from the tunable filter and the local oscillator.

Implementations of these aspects may include one or more of the following features.

The tuner may further include in one or more embodiments an RSSI (Received Signal Strength Indicator) capable of detecting strength of an output signal of the low noise amplifier and adjusting an amplification gain of the low noise amplifier in response to the detected strength of the output signal of the low noise amplifier.

In one or more embodiments, the tunable filter may divide the frequency band of the desired RF signal into a plural number and may be capable of coupling in parallel a plurality of passive tunable filters capable of filtering the RF signal of each frequency band.

In one or more embodiments, the tunable filter may couple in a parallel hybrid circuit an active tunable filter for filtering RF signals of low frequency band and a passive tunable filter for filtering RE signals of high frequency band.

In one or more embodiments, the passive tunable filter may include a variable capacitor capable of varying a center frequency by allowing a capacitance to be varied in response to the channel control signal.

In one or more embodiments, the tunable filter may further include a filter core as a passive tunable filter; a first impedance converter for adjusting an output impedance of the low noise amplifier, and a first switch for inputting the output signal of the low noise amplifier to a filter core via the first impedance converter or bypassing the output signal of the low noise amplifier to input the output signal to the filter core by being switched in response to the channel control signal.

In one or more embodiments, the tunable filter may further include a second impedance converter interposed between the filter core and the harmonic reject mixer, and a second switch for inputting the output signal of the filter core to the mixer via the second impedance converter or for bypassing the output signal of the filter core to input the output signal to the mixer.

In one or more embodiments, the tuner may further include a tone generator for generating a tone signal in response to an output signal of the local oscillator, and a multiplexer for selecting an output signal of the low noise amplifier or the tone generator in response to a switching signal and inputting the output signal to the variable tunable filter.

In one or more embodiments, the tuner may further include an intermediate frequency (IF) signal processor for filtering an output signal of the mixer, correcting errors of In-phase and Quadrature IF signals and outputting the corrected errors to a demodulator.

In one or more embodiments, the IF signal processor may produce a channel control signal and adjust a center frequency or a cut-off frequency of the tunable filter In one or more embodiments, the IF signal processor may include a frequency converting function capable of converting the frequency of the IF signal to a frequency required by the demodulator.

In one or more embodiments, the IF signal processor may process the IF signal in an analogue method or a digital method.

In one or more embodiments, the mixer can be a RF mixer, an I/Q mixer, a HRM (harmonic rejection mixer), etc.

According to an embodiment, the present invention provides A tuner comprising: an amplifier configured to amplify a radio frequency (RF) signal received by the tuner; a tunable filter configured to filter an output signal of the amplifier by varying filter characteristics of the tunable filter in response to a channel control signal, the filter characteristics of the tunable filter including filter type characteristics of the tunable filter; and a mixer configured to generate In-phase and Quadrature IF signals by mixing an output signal of the tunable filter and a local oscillator signal.

According to another embodiment, the present invention provides a method for processing an RF signal using a tuner including an antenna and a tunable filter, the method comprising: amplifying the RF signal received through the antenna; varying filter characteristics of the tunable filter in response to a channel control signal, the filter characteristics of the tunable filter including filter type characteristics of the tunable filter; selectively filtering the amplified RF signal through the tunable filter having the varied filter characteristics; and generating In-phase and Quadrature IF signals by mixing an output signal of the tunable filter and a local oscillator signal.

According to another embodiment, the present invention provides a tuner comprising: a tunable filter configured to filter a RF signal according to a channel control signal, the tunable filter including an impedance converter for receiving the RF signal and a filter core coupled to the filter core, wherein the impedance converter is selectively operated according to the channel control signal so as to vary filter characteristics of the tunable filter for filtering the RF signal; and a mixer configured to mix an output signal of the tunable filter and a local oscillator signal.

Therefore, the tuner according to embodiments of the present invention can receive a television broadcasting signal of a desired channel in a cleaner and more accurate manner.

DETAILED DESCRIPTION

A detailed description of one or more implementations of embodiments of the invention is provided below along with accompanying figures that illustrate the features of the invention. The present disclosure is described in connection with such implementations, but the disclosure is not limited to any implementation. The scope of the disclosure is limited only by the claims and the disclosure encompasses numerous alternatives, modifications and equivalents. Numerous specific details are set forth in the following description in order to provide a thorough understanding of the disclosure. These details are provided for the purpose of example and the disclosure may be practiced according to the claims without some or all of these specific details. For the purpose of clarity, some technical material that is known in the technical fields related to the invention has not been described in detail so that the disclosure is not unnecessarily obscured.

A tuner having a configuration using an In-phase and Quadrature IF signal may low-noise-amplify an RF (Radio Frequency) signal received by an antenna using a low-noise amplifier; and generate an I channel and Q channel IF signal by mixing the low-noise amplified RF signal with a local oscillator (hereinafter also referred to as LO) signal. The tuner may provide to a demodulator the generated I channel and Q channel IF signal after performing a signal processing such as filtering or the like.

It will be understood that the tuner should generate a clean IF signal of I channel and Q channel free from harmonics or other noise to produce signals resulting in clean images on a screen which is free from noise. To accomplish this, a required harmonic rejection is approximately 65 dBc. However, the harmonic rejection in a mixer equipped with the tuner is typically approximately 35 dBc. Therefore, the tuner should be equipped with means capable of rejecting harmonic of approximately 30 dBc. The present invention is directed to tuners including such a tuner, but is not limited thereto and encompasses tuners having other capabilities.

Figure 1:
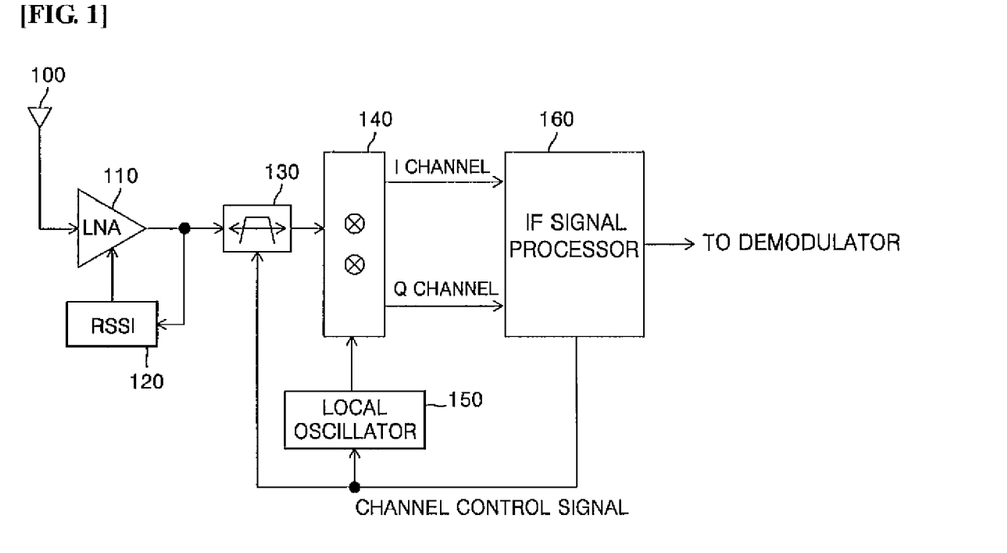
FIG. 1 is a block diagram illustrating an exemplary implementation of a tuner according to an embodiment of the present invention.

FIG. 1 is a block diagram illustrating an exemplary implementation of a tuner according to an embedment of the present invention, where reference numeral 100 represents an antenna, and reference numeral 110 represents a low noise amplifier.

Referring to FIG. 1, the low noise amplifier 110 amplifies a radio frequency (RF) signal of preferably wide band received via the antenna 100 to a low noise signal. The RF signal can be a broadcasting signal such as a television broadcasting signal, data broadcasting signal, DTV broadcasting signal, etc., but is not limited thereto.

The reception strength of the RF signal received via the antenna 100 is not uniform. Therefore, a received signal strength indicator (RSSI 120) is provided and receives the RF signal amplified by the low noise amplifier 110 to detect the strength of the RF signal outputted by the low noise amplifier 110. The RSSI 120 generates a gain control signal in response to the detected strength of the RF signal, adjusts an amplification gain of the low noise amplifier 110 in response to the generated gain control signal, and adjusts the strength of the RF signal outputted by the low noise amplifier 110 to a predetermined level. The RF signal of the low noise amplifier 110 adjusted to a predetermined level is inputted into a tunable filter 130.

A center frequency and/or cut-off frequency of the tunable filter 130 is changed according to a channel control signal outputted by an IF signal processor 160, and the tunable filter 130 filters the RF signal outputted by the low noise amplifier 110 according to the channel control signal. The channel control signal is used to control a channel and can be, e.g., a center frequency signal, a cut-off frequency signal, or other suitable signal.

The tunable filter 130 may constitute preferably one or more passive tunable filters using inductor(s) and variable capacitor(s) as passive elements, but may be composed of active filter(s). If a passive tunable filter is used in the tunable filter 130, the capacitance of the variable capacitor of the passive tunable filter may be changed in response to the channel control signal inputted from the IF signal processor 160, and the tunable filter 130 may adjust the center frequency and/or the cut-off frequency to filter the RF signal inputted from the low noise amplifier 110.

The tuner further includes a local oscillator 150 for generating a local oscillator signal based on the channel control signal, and a mixer 140 for mixing the RF signal outputted from the tunable filter 130 with the local oscillator signal to generate a signal to be inputted to the IF signal processor 160. The mixer 140 can be any known mixer, and can be, e.g., a RF mixer, an I/Q mixer, a HRM (harmonic rejection mixer), etc. but can be other suitable mixer. All components of the tuner are operatively coupled and configured. If desired, the tuner may include additional components.

Figure 2:
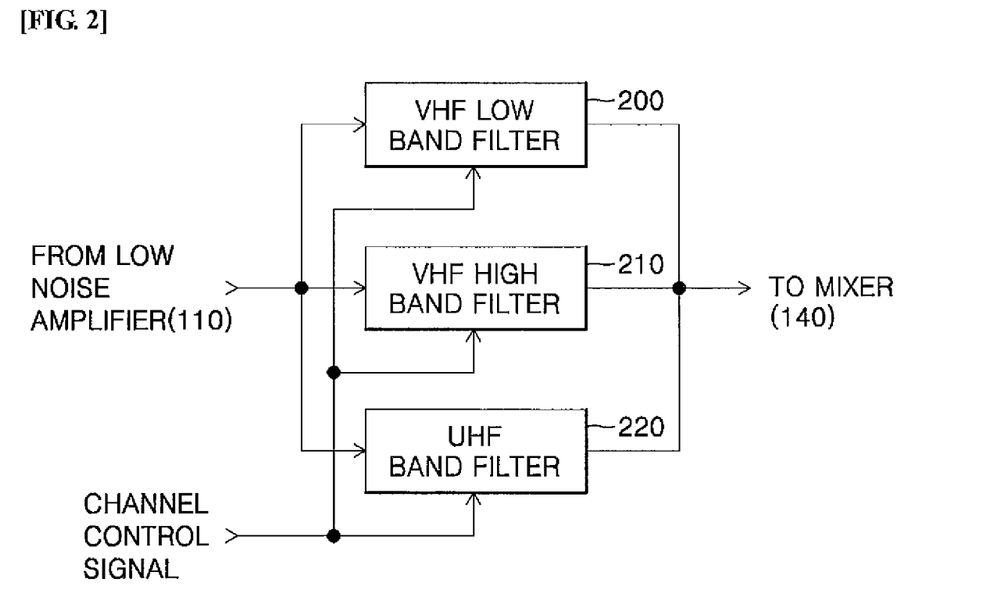
FIG. 2 is a block diagram illustrating an exemplary implementation of a variable tunable filter of a tuner according to an embodiment of the present invention.
Figure 3:
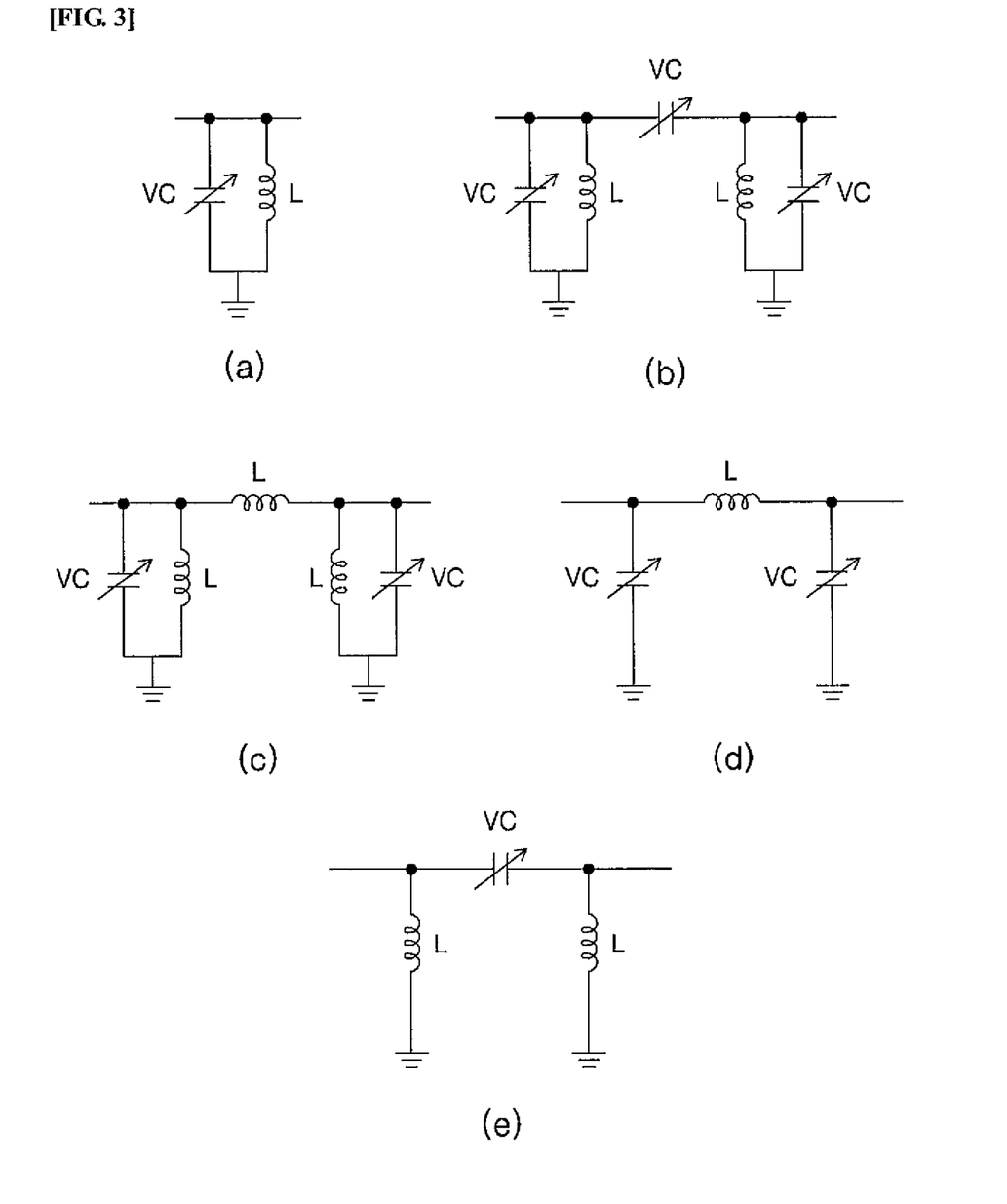
FIGS. 3(a) to 3(c) are various examples of circuit diagrams each illustrating an exemplary configuration of a VHF low band filter, a VHF high band filter and a UHF band filter in case a broadcasting signal received from a variable tunable filter is a single signal according to an embodiment of the present invention.

FIG. 2 is a block diagram illustrating one exemplary implementation of the variable tunable filter 130 of the tuner according to an embodiment of the invention.

Referring to FIG. 2, the tunable filter 130 may filter in such a manner that a frequency band of the RF signal in the range of 48 MHz~1 GHz is divided into a plurality of bands.

For example, the frequency band of the RF signal desired to receive may be divided into a very high frequency (VHF) (which may be divided into a low band and a high band) and an ultra high frequency (UHF). As one implementation then, the tuner 130 includes a VHF low band filter 200, a VHF high band filter 210 and a UHF band filter 220. These filters 200, 210 and 220 are preferably a plurality of passive tunable filters each capable of filtering the RF signal of each divided frequency band, and may be constituted and coupled in parallel. The RF signal filtered by the VHF low band filter 200, the VHF high band filter 210 and the UHF band filter 220 is inputted into a mixer 140. In one example, depending on the channel control signal, one or more of the filters 200, 210 and 220 are selectively operated.

The VHF low band filter 200, the VHF high band filter 210 and the UHF band filter 220 may be formed by a plurality of inductors and a plurality of variable capacitors in series and/or in parallel.

For example, in case a broadcasting signal outputted by the low noise amplifier 110 is a single signal, the VHF low band filter 200, and/or the VHF high band filter 210 and/or the UHF band filter 220 may be formed by a plurality of variable capacitors (VCs) and a plurality of inductors (Ls) in series or in parallel, as shown in different examples of FIGS. 3(a) to 3(e). As shown in FIGS. 3(a) to 3(e), one or more of the filters 200, 210 and 220 can include one or more variable capacitors VCs and one or more inductors Ls, which are connected in series and/or parallel. Other combinations or other examples are possible.

Figure 4:
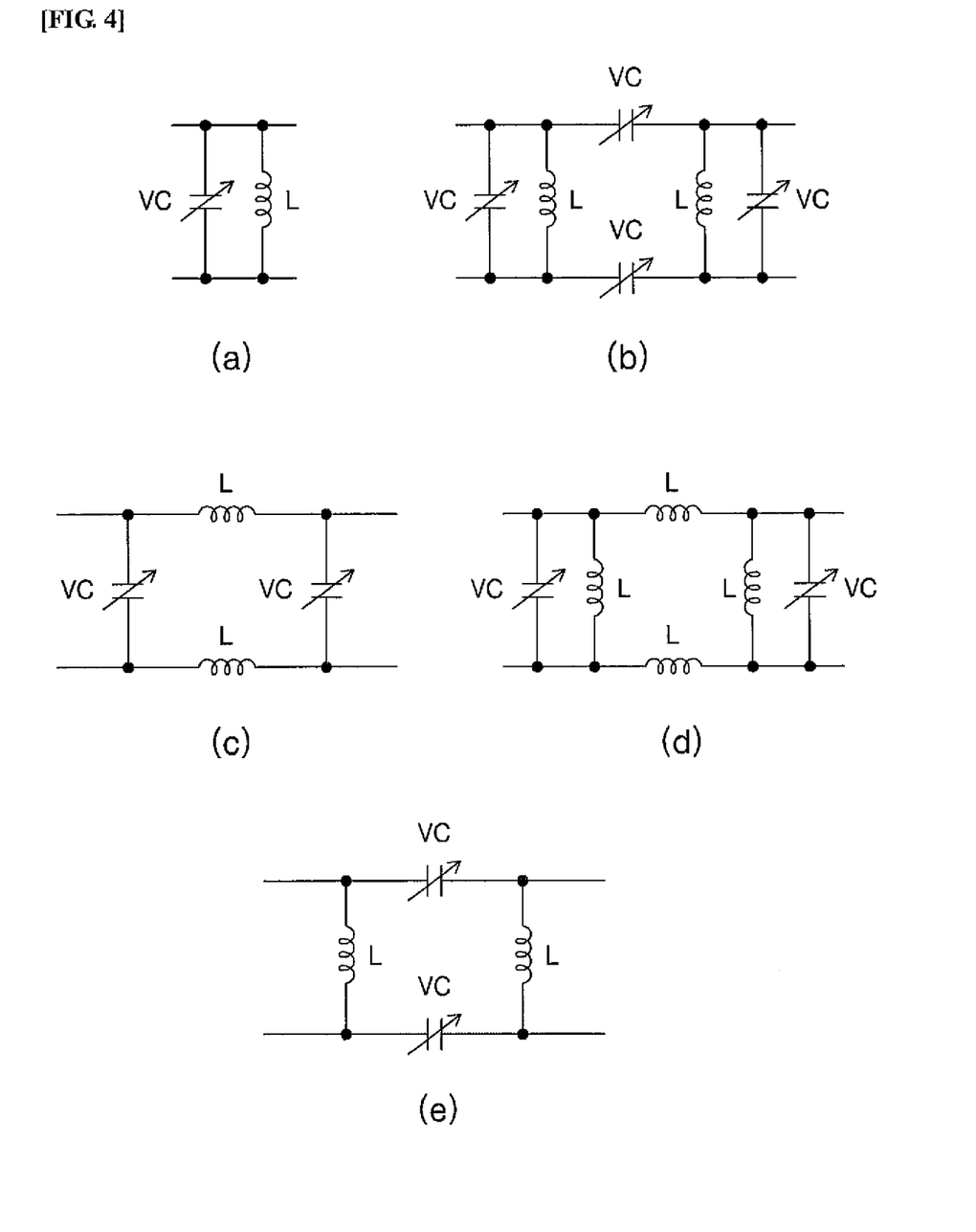
FIGS. 4(a) to 4(e) are various examples of circuit diagrams each illustrating an exemplary configuration of a VHF low band filter, a VHF high band filter and a UHF band filter in case a broadcasting signal received from a variable tunable filter is a differential signal according to an embodiment of the present invention.

In case the broadcasting signal outputted by the low amplifier 110 is a differential signal, one or more of the VHF low band filter 200, the VHF high band filter 210 and the UHF band filter 220 may be formed by a plurality of variable capacitors (VCs) and a plurality of inductors (Ls) in series and/or in parallel, as shown in different examples of FIGS. 4(a) to 4(c). Other combinations or examples are possible.

It will be also understood that the present disclosure may be implemented in such a way that the VHF low band filter 200, the VHF high band filter 210 and the UHF band filter 220 are formed by various combinations comprising a plurality of variable capacitors (VCs) and a plurality of inductors (Ls), in addition to those shown in FIGS. 3a to 3e and/or FIGS. 4(a) to 4(e).

It will be understood that capacitance of the variable capacitors (VCs) respectively disposed in the VHF low band filter 200, the VHF high band filter 210 and the UHF band filter 220 may be changed by the channel control signal outputted by the IF signal processor 160 so as to change the center frequency and/or the cut-off frequency.

Figure 5:
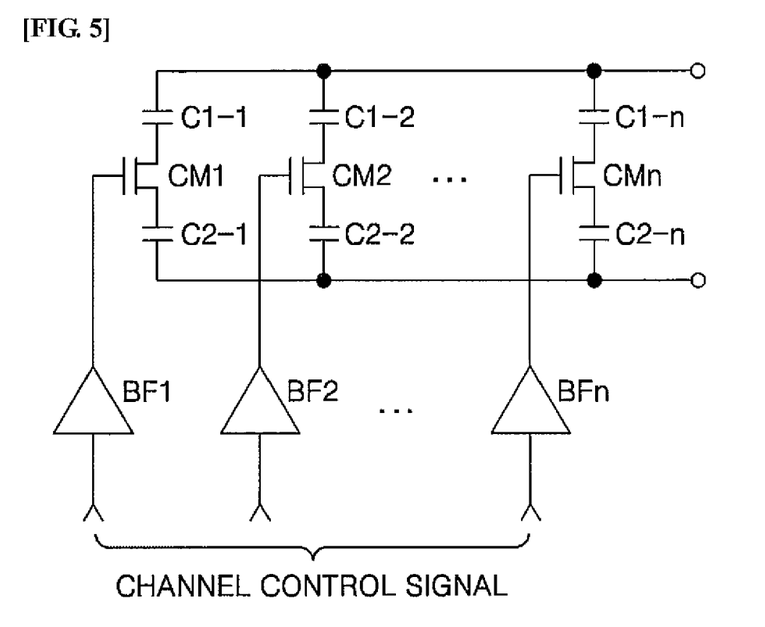
FIG. 5 is a circuit diagram illustrating an exemplary implementation of a variable capacitor according to an embodiment of the present invention.

Referring to FIG. 5, each of the variable capacitors (VCs) in the filter(s) 200, 210, 220 may connect a capacitor (C1-1), a complementary metal-oxide-semiconductor (CMOS) transistor (CM1) and a capacitor (C2-1); a capacitor (C1-2), a CMOS transistor (CM2) and a capacitor (C2-2); . . . ; and a capacitor (C1-n), a CMOS transistor (CMn) and a capacitor (C2-n) in series. Furthermore, the serially connected capacitor (C1-1), the complementary metal-oxide-semiconductor (CMOS) transistor (CM1) and the capacitor (C2-1); the capacitor (C1-2), the CMOS transistor (CM2) and the capacitor (C2-2); . . . ; and the capacitor (C1-n), the CMOS transistor (CMn) and the capacitor (C2-n) may be connected in parallel to each other. The channel control signal outputted by the IF signal processor 160 may be applied to the gates of the CMOS transistors (CM1, CM2, . . . CMn) via buffers (BF1, BF2, . . . BFn).

When the CMOS transistor (CM1) is conducted in response to the channel control signal, the variable capacitor (MC) comes to have a capacitance of the capacitors (C1-1, C2-1) connected in series. When the CMOS transistors (CM1, CM2) are made to be conductive in response to the channel control signal, the variable capacitor (VC) may have a capacitance of the serial capacitors (C1-1, C2-1) and the serial capacitors (C1-2, C2-2) connected in parallel.

Furthermore, if all the CMOS transistors (CM1, CM2, . . . CMn) become conductive in response to the channel control signal, the variable capacitor (VC) may have a capacitance of the serial capacitors (C1-1, C2-1) (C0-2, C2-2) . . . (C1-n, C2-n) and the serial capacitors (C1-1, C2-1) (C1-2, C2-2) . . . (C1-n, C2-n) that are connected in parallel.

As a result, each center frequency and/or cut-off frequency of the VHF low band filter 200, the VHF high band filter 210 and the UHF band filter 220 may be varied in response to the channel control signal as the capacitance of the variable capacitor (VC) is changed to filter the RF signal of the desired channel.

In some cases, it may be advantageous to implement the tunable filter 130 as an active filter in the low frequency, such that an active tunable filter is used for the low frequency band and a passive tunable filter is utilized for a harmonic band. That is, the VHF low band filter 200 may use the active type filter for filtering the RF signal, and the VHF high band filter 210 and the UHF band filter 220 may use a hybrid type filter coupled in parallel with passive tunable filters. Other combinations may be possible.

Figure 6:
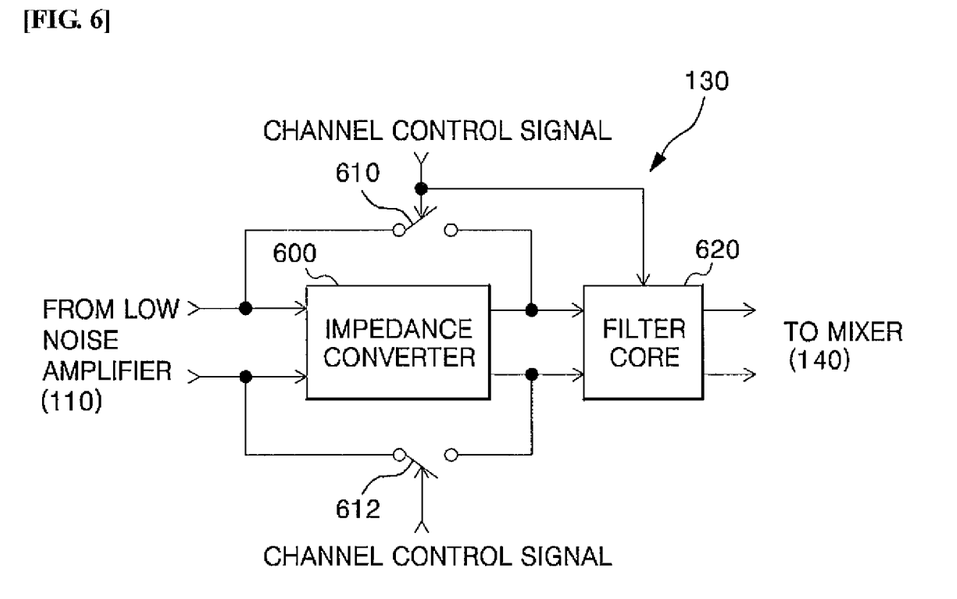
FIG. 6 is a block diagram illustrating another exemplary implementation of a variable tunable filter according to an embodiment of the present invention.

FIG. 6 is a block diagram illustrating another exemplary implementation of the tunable filter 130 according to an embodiment of the present invention. The tunable filter 130 of FIG. 6 corresponds to the tunable filter 130 of FIG. 1, but can be part of other tuner. That is, the tunable 130 of FIG. 6 can be used in the tuner of FIG. 1.

Referring to FIG. 6, the tunable filter 130 is configured with a passive tunable filter. The passive tunable filter may include a filter core 620, a first impedance converter 600 for converting an output impedance of the low noise amplifier 110 to an impedance in which the filter core 620 can have a maximum filtering characteristic, and first switches 610, 612 being switched according to the channel control signal. According to the operations of the switches 610, 612, an output signal of the low noise amplifier 110 passes the first impedance converter 600 and then inputted to the filter core 620, or the output signal of the low noise amplifier 110 bypasses (skips) the impedance converter 600 and is inputted to the filter core 620.

For example, according to the channel control signal, both switches 610 and 612 are simultaneously closed or opened. If the switched 610 and 612 are closed, the output signal of the low noise amplifier 110 bypasses (skips) the impedance converter 600 and is directly inputted to and processed by the filter core 620 according to the channel control signal. On the other hand, if the switches 610 and 612 are closed, the output signal of the low noise amplifier 110 is inputted to and processed by the impedance converter 600, and then the signal outputted from the impedance converter 600 is inputted to and processed by the filter core 620 according to the channel control signal.

The impedance converter 600 can function as a high pass filter, whereas the filter core 620 can function as a low pass filter. The filter core 620 may constitute any one structure, for example, that is illustrated in the different examples of FIGS. 3(a) to 3(e), and FIGS. 4(a) to 4(e).

Another exemplary implementation of the tunable filter 130 may selectively convert the characteristic of the tunable filter 130 to a low pass filter type or a band pass filter type based on the same hardware as the first switches 610, 612 are turned on and off.

In one exemplary implementation, in case the filter core 620 is configured to function as a low pass filter, and an output signal of the low noise amplifier 110 travels through the first switches 610, 612 to be directly inputted to the filter core 620, the tunable filter 130 is operated as a low pass filter. In case the first switches 610, 612 are opened to allow the output signal of the low noise amplifier 110 to be inputted to the filter core 620 after passing through the first impedance converter 600, the first impedance converter 600 and the filter core 620 are coupled to operate as a band pass filter In another exemplary implementation, a frequency band coverable by the tunable filter 130 may be broadened to cover a wide band with a relatively fewer number of filter cores.

Figure 7A:
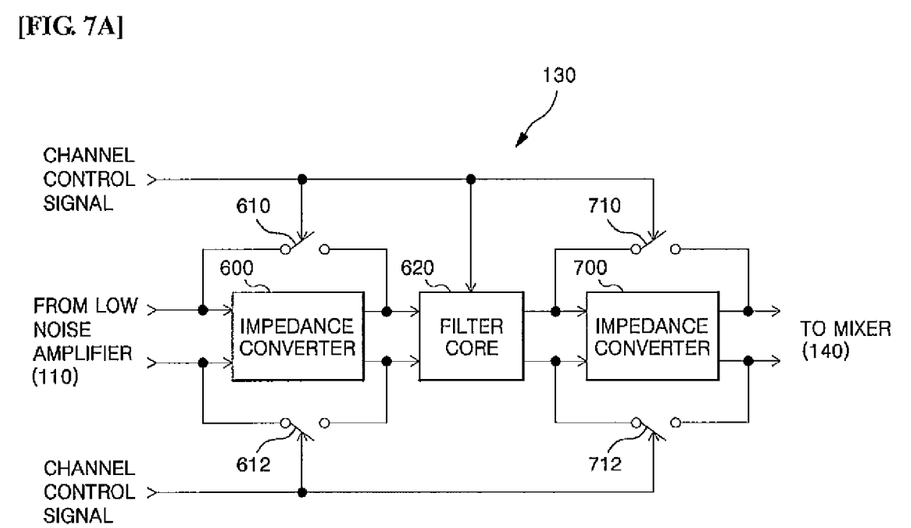
FIG. 7A is a block diagram illustrating still another exemplary implementation of a variable tunable filter according to an embodiment of the present invention.
Figure 7B:
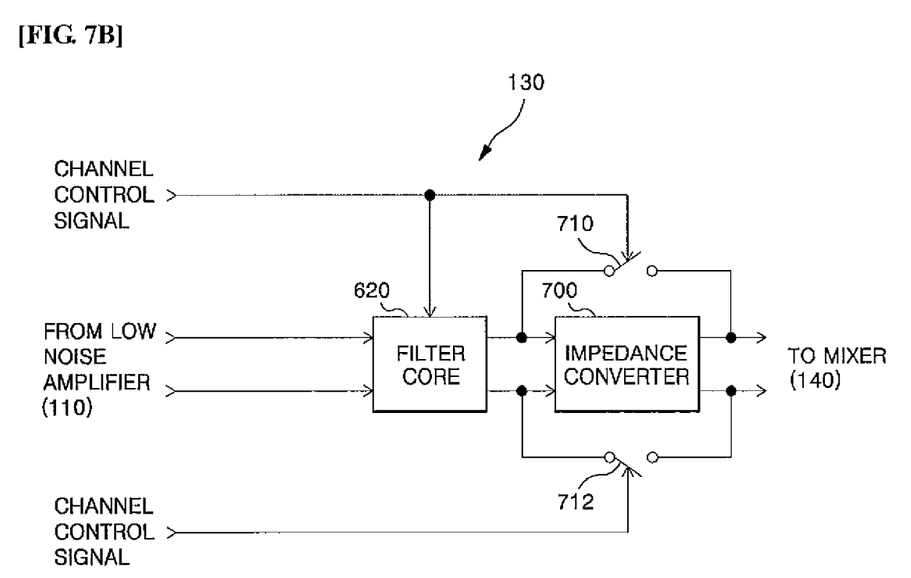
FIG. 7B a block diagram illustrating still another exemplary implementation of a variable tunable filter according to an embodiment of the present invention.

As variations of FIG. 6, additional impedance converter(s) and/or filter core(s) may be provided as part of the tunable filter 130 in addition to the impedance converter 600 and the filter core 620. An example of such configuration where two impedance converters and a filter core disposed between the two impedance converters are provided in the tunable filter 130 is illustrated in FIG. 7A. Further, the order in which these components of the tunable filter 130 are coupled may vary, and in fact, any order may be possible. An example of such configuration where the filter core is disposed before the impedance converter of the tunable filter is illustrated in FIG. 7B.

Particularly, FIG. 7A is a block diagram illustrating still another exemplary implementation of a variable tunable filter in a tuner of the present invention. The tunable filter of FIG. 7A can be the tunable filter 130 in the tuner of FIG. 1.

Referring to FIG. 7A, a second impedance converter 700 can be provided between the filter core 620 and the mixer 140 as a variation of the tunable filter 130 of FIG. 6. The tunable filter of FIG. 7A may further include second switches 710, 712 in which an output signal of the filter core 620 bypasses the second impedance converter 700 and is inputted to the mixer 140, or an output signal of the filter core 620 is inputted to the second impedance converter 700 and then inputted to the mixer 140.

The function of the second impedance converter 700 and the second switches 710, 712 in the passive tunable filter is the same as that of the first impedance converter 600 and the first switches 610, 612. All the first and second switches 610, 612, 710, 712 are simultaneously closed together or opened together according to the channel control signal. For instance, when the first and second switches 610, 612, 710, 712 are opened together, then the output signal of the low noise amplifier 110 is processed through the first impedance converter 600, the filter core 620 and then the second impedance converter 700, where the output signal of the second impedance converter 700 is inputted to the mixer 140. On the other hand, when the first and second switches 610, 612, 710, 712 are closed together, the first and second impedance converters 600 and 700 are bypassed. As a result, the output signal of the low noise amplifier 110 is inputted directly to the filter core 620, and the output signal of the filter core 602 is directly outputted to the mixer 140.

Each of the first and second impedance converters 600 and 700 can function as a high pass filter, whereas the filter core 620 can function as a low pass filter. The filter core 620 may constitute any one structure, for example, that is illustrated in the different examples of FIGS. 3(a) to 3(e), and FIGS. 4(a) to 4(e) as mentioned above.

FIG. 7B is a block diagram illustrating still another exemplary embodiment of a variable tunable filter in a tuner of the present invention. The detailed description of the components of FIG. 7B is omitted since the same or similar components of FIG. 6 and/or 7A are used.

In FIG. 7B, as a variation to FIG. 6, the order of the impedance converter and the filter core is switched. More particularly, the tunable filter 130 of FIG. 7B includes the filter core 620, the impedance filter 700 (or 600) provided after the filter core 620, and the switches 710, 712. All these components have been discussed above.

In operation, for example, when the switches 710, 712 are closed together according to the channel control signal, the output signal of the low noise amplifier 110 is processed by the filter core 620 according to the channel control signal, and the output signal of the filter core 620 bypasses the impedance converter 700 and is directly inputted to the mixer 140. On the other hand, when the switches 710, 712 are opened together according to the channel control signal, the output signal of the low noise amplifier 110 is processed by the filter core 620 according to the channel control signal, and the output signal of the filter core 620 is inputted to and processed by the impedance converter 700. Then the output signal of the impedance converter 700 is inputted to the mixer 140. As mentioned above, the filter core 620 can function as a low pass filter, whereas the impedance converter 700 can function as a high pass filter. As such, any configuration which allows the filter core 620 and the impedance converters 600 and 700 to function accordingly can be used.

As noted above and returning to FIG. 1, the RF signal filtered by the tunable filter 130 discussed above is inputted to the mixer 140. The local oscillator 150 generates a local oscillator signal of a predetermined frequency in response to the channel control signal, and the local oscillator signal thus generated is inputted to the mixer 140.

Successively, the mixer 140 mixes the RF signal outputted from the tunable filter 130 with the local oscillator signal outputted from the local oscillator 150 to generate a zero IF signal or a low In-phase and Quadrature IF signal.

The I channel and Q channel IF signal thus produced is inputted to the IF signal processor 160 and processed therein.

The IF signal processor 160 may process the IF signal of I channel and Q channel in an analogue method or a digital method.

The IF signal processor 160 may be configured with a filter. The filter configured with the IF signal processor 160 may additionally remove harmonics generated in the course of mixing the local oscillator signal with RF signal at the mixer 140 and the harmonic-rejected signal may be provided to a demodulator or other suitable component or device.

Furthermore, the IF signal processor 160 may be configured with a frequency converter, where the frequency converter may convert the IF signal frequency using a frequency required by the demodulator and provide the converted IF signal frequency to the demodulator.

Furthermore, The IF signal processor 160 may include an I/Q error corrector, where the I/Q error corrector may correct the error of IF signal in the I channel and the Q channel and output the corrected error to the demodulator.

Furthermore, The IF signal processor 160 may include a controller, e.g., a digital signal processor (DSP), where the controller may generate a channel control signal in response to a user manipulation to adjust a frequency of a local oscillator signal of the local oscillator 150 and also adjust the center frequency and/or a cut-off frequency of the tunable filter of the present invention.

Figure 8:
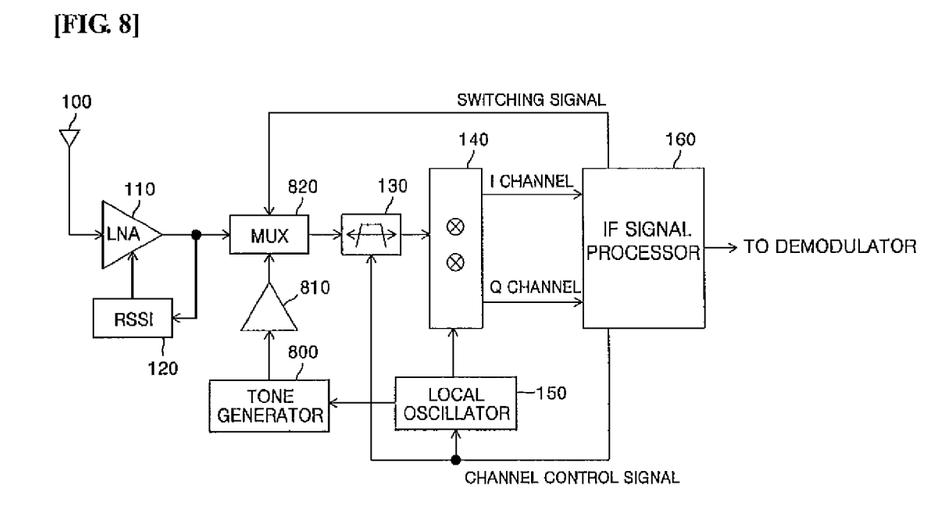
FIG. 8 is a block diagram illustrating another exemplary implementation of a tuner according to an embodiment of the present invention.

FIG. 8 is a block diagram illustrating another exemplary implementation of a tuner according to an embodiment of the present invention.

Referring to FIG. 8, the tuner includes all the components of the tuner of FIG. 1. The tuner may further include a tone generator 800 for generating a tone signal in response to the local oscillator signal of the local oscillator 150, an amplifier 810 for amplifying the tone signal generated by the tone generator 800, and a multiplexer 820 for switching between an output signal of the low noise amplifier 110 and an output signal of the amplifier 820 in response to a switching signal of the IF signal processor 160 so as to output selectively the selected signal to the tunable filter 130.

According to the present invention, if a reception channel of a broadcasting signal is switched, the IF signal processor 160 generates a channel control signal to a corresponding channel and a switching signal as well so as to allow the multiplexer 820 to select an output signal of the amplifier 810.

Successively, the local oscillator 150 generates a local oscillator signal of a predetermined frequency in response to the channel control signal, and the tone generator 800 generates a tone signal in response to the generated local oscillator signal.

The tone signal generated by the tone generator 800, if selected by the multiplexer 820, is filtered by the tunable filter 130 and inputted to the mixer 140. As mentioned above, the tuner 130 can be any tuner discussed above, e.g., the tuner in FIG. 2, 6, 7A or 7B.

The mixer 140 mixes the inputted tone signal with the local oscillator signal generated by the local oscillator 150 and converts the mixed signal to a base band signal. Then the base band signal is filtered by base band filters (not shown) and converted to a digital signal by an analogue-to-digital converters (not shown), to be inputted to the IF signal processor 160.

Successively, the IF signal processor 160 checks the strength of the tone signal, adjusts a capacitance of the variable capacitor of the tunable filter 130 in order to increase the checked tone signal to a maximum, and establishes the center frequency and/or the cut-off frequency of the tunable filter 130.

When the center frequency of the tunable filter 130 is determined by the above processes, the IF signal processor 160 controls the multiplexer 820, whereby a broadcasting signal outputted by the low noise amplifier 110 is inputted to the tunable filter 130 via the multiplexer 820 and filtered by the tunable filter 130.

For example, the center frequency and/or the cut-off frequency of the tunable filter 130 is adjusted, and then the RF signal is received whenever the reception channel is changed in another exemplary implementation. As a result, the RF signal of corresponding channel can be accurately received.

In the embodiments as discussed above, the filter characteristics of the tunable filter in the tuner are selectively varied in response to the channel control signal. For instance, the filter type of the tunable filter and/or the center frequency of the tunable filter is varied in response to the channel control signal. As a non-limiting example in FIG. 2, the low and high pass filters 200, 210 and 220 (different types of filters) are selectively operated to change the filter characteristics of the tunable filter 130. In other non-limiting examples of FIGS. 6-7B, the filter core and/or the impedance converter is selectively operated to provide effects of a high pass filter and/or a low pass filter and thereby change the filter characteristics of the tunable filter 130 according to the channel control signal. The center frequency of the tunable filter is also selectively changed as the capacitance of the variable capacitor(s) in the tunable filter is varied according to the channel control signal.

The tuner according to the present disclosure can receive television broadcasting signals of preferred channels more clearly and accurately.

The above description of the disclosed implementations is provided to enable any person of ordinary skill in the art to make or use the disclosure. Various modifications to these implementations will be readily apparent to those of ordinary skill in the art, and the generic principles defined herein may be applied to other implementations without departing from the spirit or scope of the disclosure. Thus, the disclosure is not intended to be limited to the implementations shown herein but is to be accorded the widest scope consistent with the principles and novel features disclosed herein.

What is claimed is:

1. A tuner comprising:
an amplifier configured to amplify a radio frequency (RF) signal received by the tuner;
a tunable filter configured to filter an output signal of the amplifier by varying filter characteristics of the tunable filter in response to a channel control signal, the filter characteristics of the tunable filter including filter type characteristics of the tunable filter; and
a mixer configured to generate In-phase and Quadrature IF signals by mixing an output signal of the tunable filter and a local oscillator signal,
wherein the tunable filter comprises:
at least one impedance converter;
at least one filter core coupled to the impedance converter; and
at least one switch configured to selectively input the output signal of the amplifier to either the impedance converter or the filter core according to the channel control signal.

2. The tuner as claimed in claim 1, wherein the filter characteristics of the tunable filter further include a center frequency of the tunable filter.

3. The tuner as claimed in claim 2, wherein the tunable filter comprises at least one variable capacitor for varying the center frequency of the tunable filter by varying a capacitance of the variable capacitor in response to the channel control signal.

4. The tuner as claimed in claim 1, wherein the filer type characteristics of the tunable filter are varied by selectively operating the tunable filter as at least one of a low pass filter, a band pass filter, and a high pass filter according to the channel control signal.

5. The tuner as claimed in claim 1, wherein the filter core functions as a low pass filter, and the impedance converter functions as a high pass filter.

6. The tuner as claimed in claim 1, wherein according to the channel control signal, the at least one switch is operated such that the output signal of the amplifier is processed through the impedance converter and the filter core, or through only the filter core.

7. The tuner as claimed in claim 1, wherein the at least one impedance converter includes a plurality of impedance converters, and the at least one filter core is one filter core positioned between the plurality of impedance converters.

8. The tuner as claimed in claim 7, wherein according to the channel control signal, the at least one switch is operated such that the output signal of the amplifier is processed through the plurality of impedance converters and the filter core, or through only the filter core.

9. The tuner as claimed in claim 1, further comprising:
a local oscillator configured to generate the local oscillator signal having a plurality of phases in response to the channel control signal.

10. The tuner as claimed in claim 1, wherein the tunable filter divides the frequency band of the RF signal into a plurality of frequency bands, and includes a plurality of passive tunable filters coupled in parallel for filtering the RF signal of each frequency band.

11. The tuner as claimed in claim 1, wherein the tunable filter couples, in a parallel hybrid circuit, an active tunable filter for filtering RF signals of low frequency band and a passive tunable filter for filtering RF signals of high frequency band.

12. The tuner as claimed in claim 11, wherein the passive tunable filter comprises at least one variable capacitor for varying a center frequency of the tunable filter by varying a capacitance of the variable capacitor in response to the channel control signal.

13. The tuner as claimed in claim 1, further comprising:
a tone generator configured to generate a tone signal in response to the local oscillator signal; and
a multiplexer configured to select either the output signal of the amplifier or an output signal of the tone generator in response to a switching signal, and to output the selected output signal to the tunable filter.

14. The tuner as claimed in claim 1, further comprising:
an intermediate frequency (IF) signal processor configured to filtering an output signal of the mixer, to correct errors of IF signals from I channel and Q channel and to output the corrected signals to a demodulator.

15. The tuner as claimed in claim 14, wherein the IF signal processor produces the channel control signal and adjusts a center frequency or a cut-off frequency of the tunable filter.

16. A tuner comprising:
an amplifier configured to amplify a radio frequency (RF) signal received by the tuner;
a tunable filter configured to filter an output signal of the amplifier by varying filter characteristics of the tunable filter in response to a channel control signal, the filter characteristics of the tunable filter including filter type characteristics of the tunable filter; and
a mixer configured to generate In-phase and Quadrature IF signals by mixing an output signal of the tunable filter and a local oscillator signal, wherein the tunable filter comprises:
a filter core configured to receive the output signal of the amplifier;
an impedance converter coupled to the filter core; and
at least one switch configured to selectively input an output signal of the filter core to either the impedance converter or the mixer according to the channel control signal.

17. A tuner comprising:
a tunable filter configured to filter a RF signal according to a channel control signal, the tunable filter including an impedance converter for receiving the RF signal and a filter core coupled to the filter core, wherein the impedance converter is selectively operated according to the channel control signal so as to vary filter characteristics of the tunable filter for filtering the RF signal; and
a mixer configured to mix an output signal of the tunable filter and a local oscillator signal.

18. The tuner as claimed in claim 17, wherein the tunable filter further includes another impedance converter coupled between the filter core and the mixer, and both impedance converters are selectively operated together according to the channel control signal so as to vary the filter characteristics of the tunable filter for filtering the RF signal.

* * * * *